(12) United States Patent
Kwon et al.

(10) Patent No.: US 8,183,633 B2
(45) Date of Patent: May 22, 2012

(54) SEMICONDUCTOR DEVICE AND METHOD FOR FORMING THE SAME

(75) Inventors: O-Kyun Kwon, Daejeon (KR); Dong-Woo Suh, Daejeon (KR); Jung-Hyung Pyo, Seoul (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/847,974

(22) Filed: Jul. 30, 2010

(65) Prior Publication Data

US 2010/0301448 A1    Dec. 2, 2010

Related U.S. Application Data

(62) Division of application No. 12/130,877, filed on May 30, 2008, now Pat. No. 7,790,567.

(30) Foreign Application Priority Data

Dec. 17, 2007    (KR) .................. 10-2007-0132314

(51) Int. Cl.
*H01L 27/12*    (2006.01)

(52) U.S. Cl. .................. 257/347; 257/547; 257/E21.56; 257/E25.566

(58) Field of Classification Search .................. 257/247, 257/547, 347
See application file for complete search history.

(56) References Cited

U.S. PATENT DOCUMENTS

| | | | | |
|---|---|---|---|---|
| 5,143,862 A | * | 9/1992 | Moslehi | 438/413 |
| 5,204,282 A | * | 4/1993 | Tsuruta et al. | 438/406 |
| 7,525,151 B2 | * | 4/2009 | Haase | 257/335 |
| 2007/0126034 A1 | * | 6/2007 | Sakai et al. | 257/288 |

FOREIGN PATENT DOCUMENTS

JP    2001-102442    *    4/2001

* cited by examiner

*Primary Examiner* — A. Sefer (57) ABSTRACT

Provided is a semiconductor and a method for forming the same. The method includes forming a buried insulating layer locally in a substrate. The substrate is etched to form an opening exposing the buried insulating layer, and a silicon pattern spaced in at least one direction from the substrate is formed on the buried insulating layer. A first insulating layer is formed to enclose the silicon pattern.

5 Claims, 11 Drawing Sheets

SEMICONDUCTOR DEVICE AND METHOD FOR FORMING THE SAME

CROSS-REFERENCE TO RELATED APPLICATIONS

This U.S. non-provisional patent application claims priority under 35 U.S.C. §119 of Korean Patent Application No. 10-2007-0132314 filed on Dec. 17, 2007, the entire contents of which are hereby incorporated by reference.

BACKGROUND OF THE INVENTION

The present invention disclosed herein relates to a semiconductor device, and more particularly, to a semiconductor device having a local silicon-on-insulator (SOI) structure and a method of forming the same.

The present invention has been derived from research undertaken as a part of IT R & D program of the Ministry of Information and Communication and Institution of Information Technology Association (MIC/IITA) [2006-S-004-02], integrated development of silicon-based high-speed optical interconnection IC.

A semiconductor device formed on a silicon-on-insulator (SOI) substrate may have high radiation tolerance and latch-up immunity, restrain the short channel effect, and operate with low power consumption, by means of a buried oxide (BOX) layer buried in a substrate under the device. Furthermore, the semiconductor device can operate at a high speed because an operating region of the semiconductor device is capacitively insulated from the substrate.

There are mainly two types of methods for forming a typical SOI substrate. One is a wafer bonding method that bonds two wafers with an oxide layer therebetween. The other is a separation by implanted oxygen (SIMOX) method. In the SIMOX method, a high concentration oxygen ion implanted layer is formed at a predetermined depth of a silicon wafer by implanting oxygen ions from the surface of the silicon wafer. Subsequently, the silicon wafer is thermally treated to form a BOX layer.

In the wafer bonding method, a SOI substrate can be obtained by bonding two silicon wafers with an oxide layer having a thickness of more than 1 micrometer. In this case, the broader the surface area of the wafer is, the more difficult it is to ensure proper bonding and uniformity of wafer thickness.

Also, a BOX layer must be formed with a thickness of more than 1 micrometer in order to integrate an optical element and an electrical element onto the SOT substrate. Accordingly, a high concentration (of greater than $5 \times 10^{18}$ atom/cm$^2$) ion implantation is required to form a BOX layer having a thickness of 1 mm in the SIMOX method. However, a high concentration ion implantation may increase the threading dislocation density, the oxide precipitate density and the lattice defects of silicon, and cause silicon inclusions and pinholes in the BOX layer. Subsequently, the reliability and the operating characteristics of a semiconductor device may be deteriorated.

SUMMARY OF THE INVENTION

Embodiments of the present invention provide a semiconductor device having a local SOI structure and a method of forming the same.

Embodiments of the present invention provide a semiconductor device capable of being efficiently highly-integrated and a method of forming the same.

Embodiments of the present invention provide methods for forming a semiconductor device comprising: forming a buried insulating layer locally in a substrate, forming an opening exposing the buried insulating layer by etching the substrate, and forming a silicon pattern on the buried insulating layer and spaced from the substrate in at least one direction, and forming a first insulating layer enclosing the silicon pattern.

In some embodiments, the first insulating layer may be formed by performing a thermal oxidation process.

In other embodiments, the first insulating layer between the silicon pattern and the substrate may define a gap region. The method may further include a second insulating layer on the first insulating layer including the gap region.

In still other embodiments, the methods may further include removing the buried insulating layer after the forming of the silicon pattern to form an air gap under the silicon pattern. The air gap is communicated with the opening. The buried insulating layer may be removed by performing a wet etching process. Forming the first insulating layer may include forming a filling insulating layer filling the air gap and the opening by performing a vapor deposition process.

In even other embodiments, forming the buried insulating layer may include forming an ion implantation mask on the substrate, forming an ion implanted layer through implanting ions in the substrate using the ion implantation mask, and performing a thermal treatment process. The ions may include oxygen ions or nitrogen ions.

In yet other embodiments, the opening may expose edges of the buried insulating layer.

Embodiments of the present invention also provide semiconductor devices comprising: a substrate; a silicon pattern on the substrate, the silicon pattern having an bottom surface and sidewalls opposite to the substrate; and an insulating pattern interposed between the substrate and the silicon pattern and contacted with the bottom surface and the sidewalls of the silicon pattern.

In some embodiments, the insulating pattern may have a 凹-shaped cross-section. The silicon pattern may be inserted into a recess region of the insulating layer pattern.

In other embodiments, the insulating pattern may include a first insulating pattern interposed between the substrate and the silicon pattern and contacting the bottom surface and sidewalls of the silicon pattern, the first insulating pattern defining a gap region between the sidewalls of the silicon pattern and the substrate, and a second insulating pattern disposed in the gap region, the second insulating pattern spaced from the silicon pattern and the substrate. The first insulating pattern and the second insulating pattern may include mutually different materials.

In further embodiments, the silicon pattern may be disposed in plurality on the insulating layer pattern.

In still further embodiments of the present invention, the substrate may include a first region and a second region. The silicon pattern and the insulating layer pattern may be disposed in the first region. The semiconductor devices may further comprise an optical device disposed in the first region and an electrical device disposed in the second region.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the drawings, the dimensions of layers and regions may be exaggerated for clarity of illustration. In addition, the sizes of the elements and the relative sizes between elements may be exaggerated for further understanding of the present invention. Furthermore, shapes of the elements illustrated in the drawings may vary according to the fabrication process variations. Therefore, it will be understood that the embodiments disclosed in this specification are not limited to the configurations illustrated in the drawings when not specifically described, and include a certain degree of variation.

Hereinafter, embodiments of the present invention will be described with the accompanying drawings.

Figure 1:
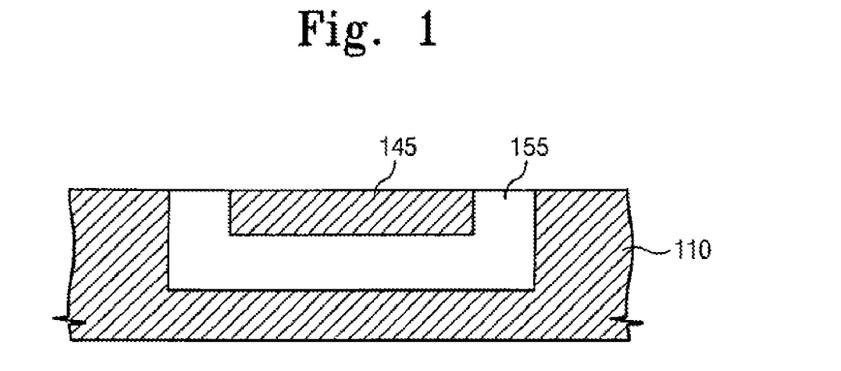
FIG. 1 is a cross-sectional view illustrating a semiconductor device according to an embodiment of the present invention.

Referring to FIG. 1, a semiconductor device according to an embodiment of the present invention will be described. A SOI insulating pattern 155 is on a substrate 110, and a SOI silicon pattern 145 is on a SOI insulating layer pattern 155. The silicon pattern 145 and the SOI insulating layer pattern 155 are locally disposed on the substrate 110 to form a semiconductor device with a local SOI structure.

The SOI insulating layer pattern 155 may have a ⊔-shaped cross-section. The SOI silicon pattern 145 may have such a shape as to be inserted into a recess region of the insulating pattern 155. Therefore, the bottom surface and sidewalls of the SOI silicon pattern 145 may be contacted with the SOI insulating pattern 155. The SOI insulating pattern 155 may separate the SOI silicon pattern 145 from the substrate 110, and electrically insulate the SOI silicon pattern 145. The top surface of the SOI silicon pattern 145 may have substantially the same height as the top surface of the substrate 110.

For example, the SOI insulating pattern 155 may be a thermal oxide layer including silicon oxide, but is not limited thereto. As described below, the SOI insulating pattern 155 may be formed with various materials according to different forming methods, and may have different thicknesses.

Figure 2:
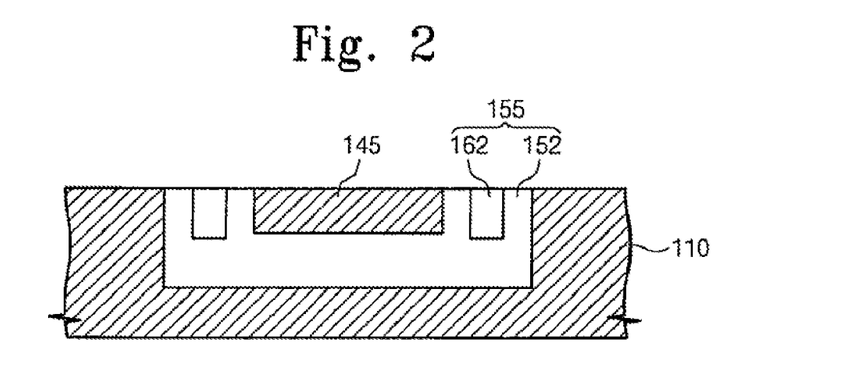
FIG. 2 is a cross-sectional view illustrating a semiconductor device according to another embodiment of the present invention.

Referring to FIG. 2, a semiconductor device according to another embodiment of the present invention will be described. Repetitive descriptions of parts identical to those in the foregoing embodiment will not be provided. A SOI insulating pattern 155 includes a first insulating pattern 152 and a second insulating pattern 162. The first insulating pattern 152 is interposed between a SOI silicon pattern 145 and a substrate 110 to separate the SOI silicon pattern 145 from the substrate 110. The second insulating patterns 162 may be disposed at both sides of the SOI silicon pattern 145. The second insulating patterns 162 are disposed at a predetermined position spaced from the SOI silicon pattern 145 and the substrate 110, respectively. The second insulating pattern 162 may be formed with the same material as the first insulating pattern 152, or a material with better insulating properties.

Figure 3:
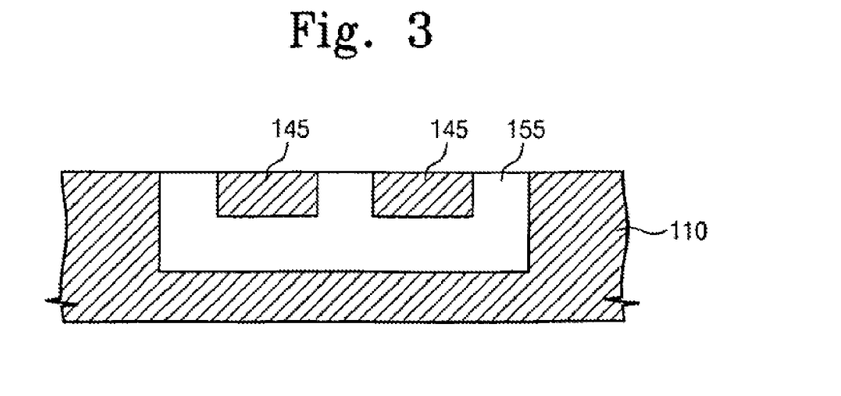
FIG. 3 is a cross-sectional view illustrating a semiconductor device according to further another embodiment of the present invention.

Referring to FIG. 3, a semiconductor device according to another embodiment of the present invention will be described. Repetitive description of parts identical to those of the foregoing embodiments will not be provided. Two SOI silicon patterns 145 may be disposed on a SOI insulating pattern 155. In another embodiment of the present invention, three or more SOI silicon patterns 145 may be disposed on a SOI insulating pattern 155. The SOI insulating pattern 155 may have a double ⊔-shape. The SOI silicon patterns 145 may have such a shape as to be inserted into the recess regions of the SOI insulating pattern 155.

Figure 4:
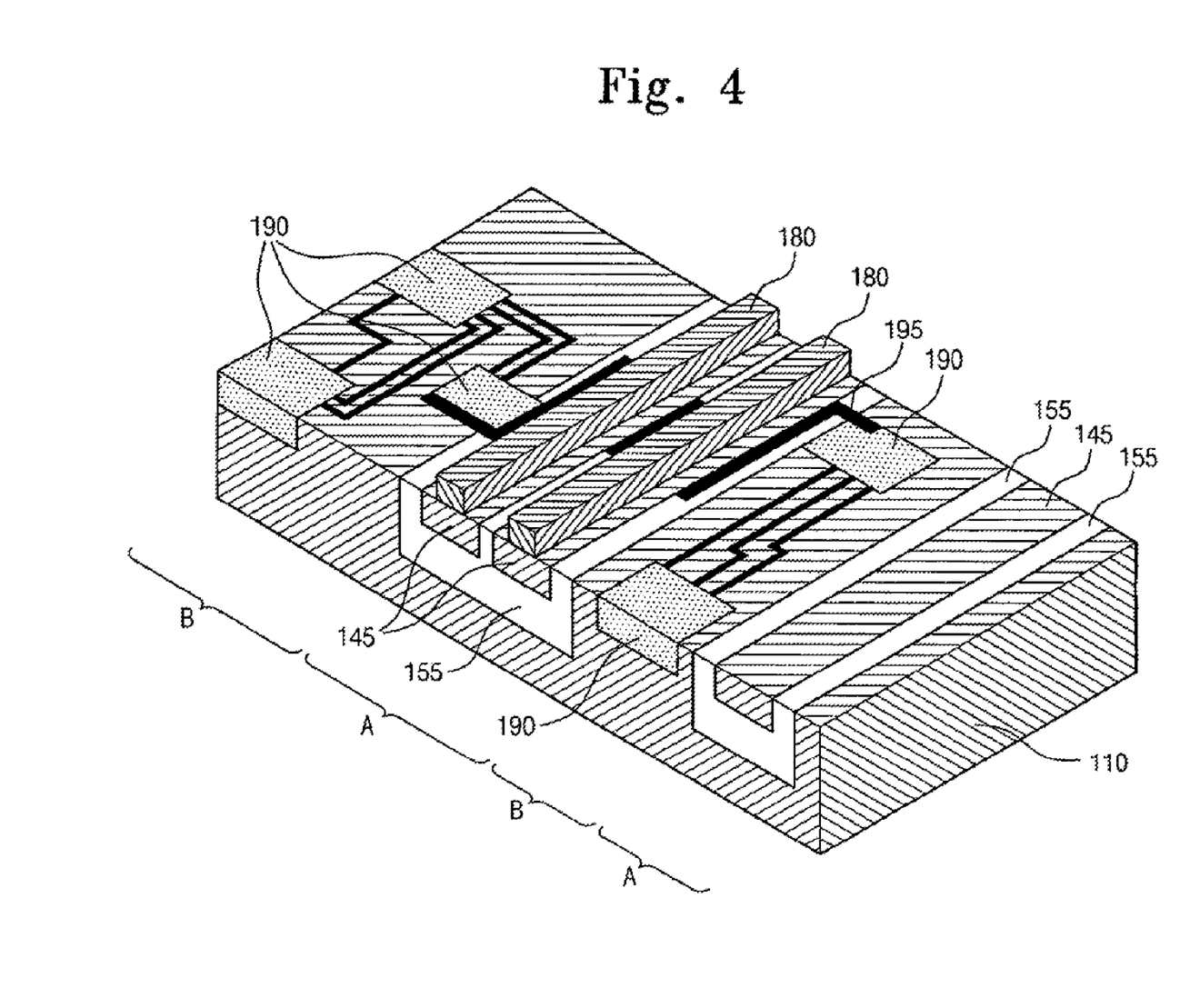
FIG. 4 is a schematic perspective view illustrating an exemplary application of a semiconductor device according to an embodiment of the present invention.

FIG. 4 is a perspective view illustrating an application of the semiconductor device according to an embodiment of the present invention. Referring to FIG. 4, the substrate 110 may include an optical device region A and an electrical device region B. A SOI silicon pattern 145 and a SOI insulating pattern 155 of a local SOI structure according to the embodiment of the present invention may be disposed on the optical device region A. The SOL silicon pattern 145 in the optical device region A may be used as an optical passive device, or an optical active device together with a semiconductor pattern 180. For example, the semiconductor pattern 180 may be formed by patterning the SOL silicon pattern 145. Various electrical devices 190 may be disposed in the electrical device region B. The optical device and the electrical device may be electrically connected with each other. According to the embodiment of the present invention, various devices including the optical devices and the electrical devices are effectively high-integrated into the same substrate.

FIGS. 5A to 5E are cross-sectional views illustrating a method according to an embodiment of the present invention for forming the semiconductor device in FIG. 1.

Figure 5A:
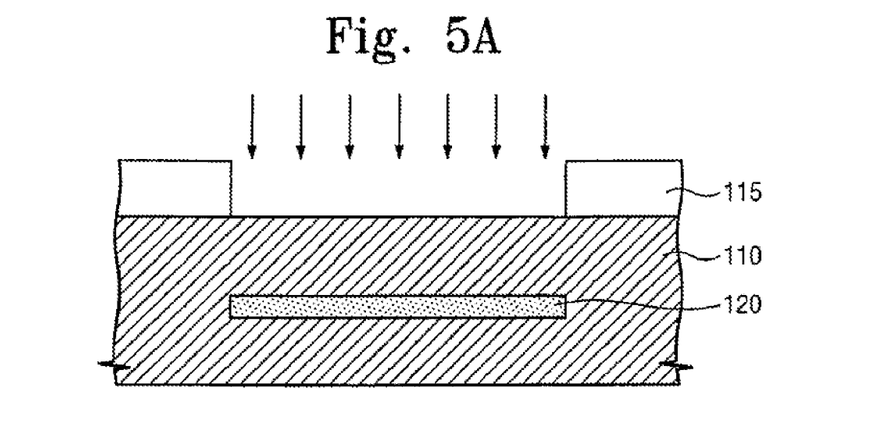
FIGS. 5A through 5E are cross-sectional views illustrating a method according to one embodiment of the present invention for forming the semiconductor device in FIG. 1.

Referring to FIG. 5A, an ion implantation mask 115 is formed on a substrate 110. The substrate 110 may be, for example, a monocrystalline silicon substrate. An ion implanted layer 120 is formed through an ion implanting process of implanting ions into the substrate 110 using an ion implantation mask 115. The ions may be an oxygen or nitrogen, and be implanted at a temperature range of about 200° C. to about 600° C. The ions may be implanted at a higher concentration of about $2\times10^{18}$ count/cm$^2$ or a lower concentration of about $2\times10^{17}$ count/cm$^2$ to $4\times10^{17}$ count/cm$^2$. Lattice defects and oxide precipitates in the substrate 110 can be reduced by implanting the ions at the lower concentration of about $2\times10^{17}$ count/cm$^2$ to $4\times10^{17}$ count/cm$^2$. A protective layer such as a silicon oxide layer may be formed on the substrate 110 to prevent the surface of the substrate 110 from being damaged by the ion implantation.

Figure 5B:
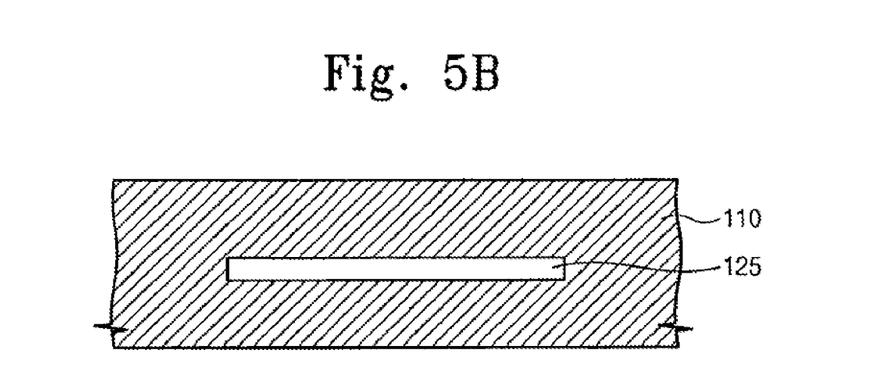

Referring to FIG. 5B, a buried insulation layer 125 is formed from the ion implanted layer 120 through a thermal treatment process. The thermal treatment is performed at a temperature range of about 1200° C. to about 1400° C. in a nitrogen or argon atmosphere. The buried insulation layer 125 may be a buried oxide or a buried nitride in accordance with the implanted ion.

Figure 5C:
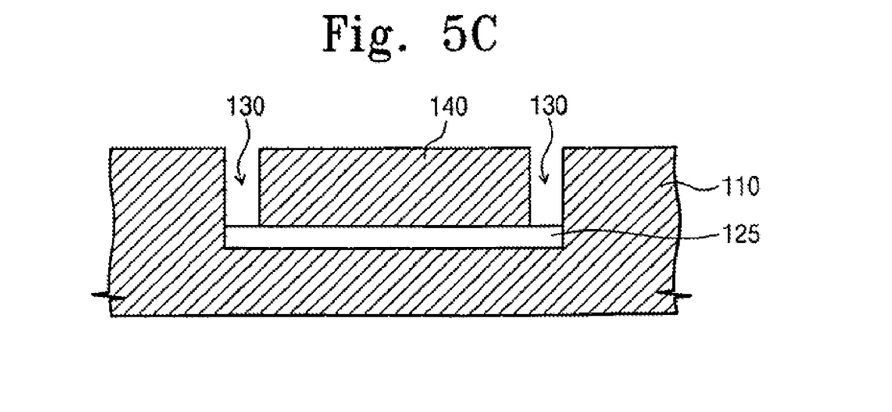

Referring to FIG. 5C, an opening 130 is formed by etching the substrate 110, which exposes the buried insulation layer 125. The opening 130 may expose the edges of the buried insulation layer 125. A silicon pattern 140 is formed on the buried insulation layer 125. The opening 130 and the buried insulation layer 125 may separate the silicon pattern 140 from the substrate 110.

Figure 5D:
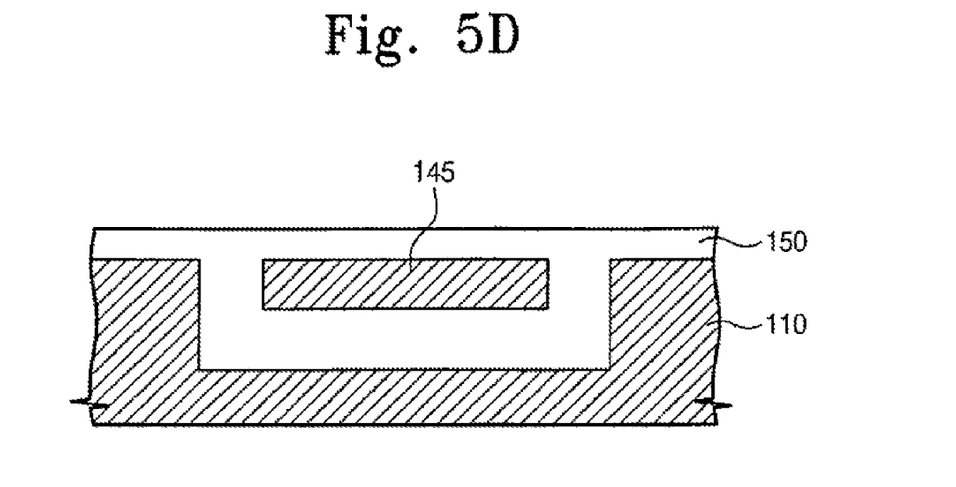

Referring to FIG. 5D, a thermal oxide layer 150 is formed on the surface of the silicon pattern 140, for example, through a thermal oxidation process. The thermal oxide layer 150 may be formed on the exposed surfaces of silicon pattern 140 and the substrate 110. When the buried insulation layer 125 is the silicon oxide layer, the thermal oxide layer 150 may be also formed on the lower surface of the silicon pattern 140 and the surface of the substrate 110, which are contacted with the buried insulation layer 125. The thickness of the thermal oxide layer 150 between a SOI silicon pattern 145 and the substrate 110 may be larger than the width of the opening 130 and the thickness of the buried insulation layer 125. The size of the silicon pattern 140 is reduced to form the SOI silicon pattern 145. That is, the thickness and the width of the SOI silicon pattern 145 may be smaller than those of the silicon pattern 140. The thermal oxide layer 150 encloses the SOI silicon pattern 145.

Figure 5E:
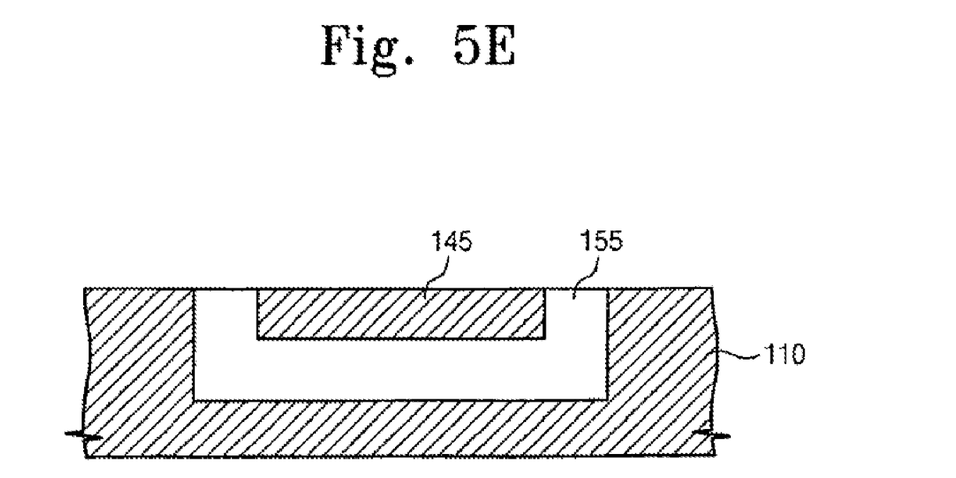

Referring FIG. 5E, a planarization process exposes the top surfaces of the SOI silicon pattern 145 and the substrate 110. A SOI insulating pattern 155 is interposed between the SOI silicon pattern 145 and the substrate 110, separating the SOI silicon pattern 145 from the substrate 110. As described above, the SOI insulating pattern 155 may be formed through the thermal oxidation process thickly enough to electrically insulate the SOI silicon pattern 145 from the substrate 110. The SOI insulating pattern 155 may have a ⊔-shaped cross-section. The SOI silicon pattern 145 may have such a shape as to be inserted into a recess region of the insulating layer pattern 155. That is, the undersurface and the side walls of the SOI silicon pattern 145 may be contacted with the SOI insulating pattern 155. The SOI insulating pattern 155 may be formed through the thermal treatment process after implanting ions into the edges of the buried insulating layer as illustrated in FIG. 5B.

Figure 6A:
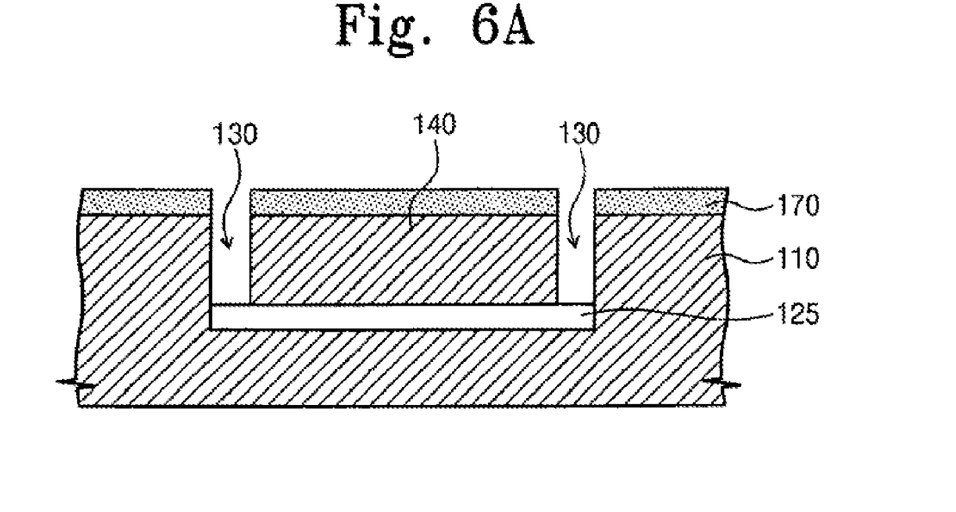
FIGS. 6A and 6B are cross-sectional views illustrating a method according to another embodiment of the present invention for forming the semiconductor device in FIG. 1.
Figure 6B:
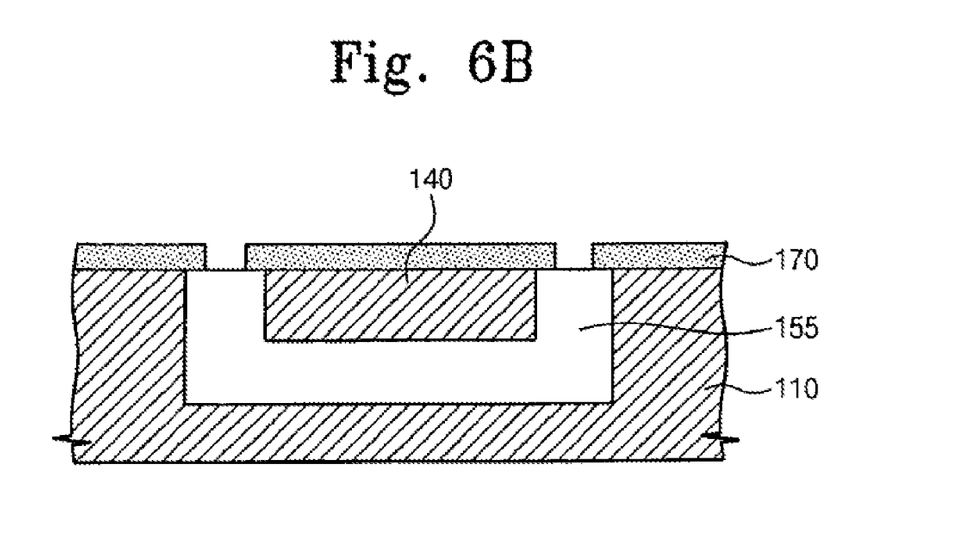

With reference to FIGS. 6A and 6B, a method according to another embodiment of the present invention of forming the semiconductor device in FIG. 1 will be described. Parts described in the above embodiment with reference to FIGS. 5A to 5C can be identically applied to this embodiment.

Referring to FIG. 6A, a mask layer 170 is formed on a silicon pattern 140 and a substrate 110. The mask layer 170 may be an oxidation inhibiting layer or an oxidation sacrificial layer. A mask pattern 170 used in the etching process to form the opening 130 may be reused as the mask layer 170.

The oxidation inhibiting layer may be formed of, for example, a silicon nitride layer, and inhibit surfaces of the silicon pattern 140 and the substrate 110 from being oxidized during the thermal oxidation process. The oxidation sacrificial layer may be formed of, for example, a polysilicon, and be oxidized during the thermal oxidation process so as to prevent the oxidation of the surfaces of the silicon pattern 140 and the substrate 110. The silicon nitride layer is used as an oxidation inhibiting layer in this embodiment.

Referring to FIG. 6B, a thermal oxide layer 150 is formed on the surface of the silicon pattern 140 through a thermal oxidation process. The thermal oxide layer 150 may be formed on the surfaces of silicon pattern 140 and the substrate 110 exposed by an opening. When the buried insulation layer 125 is the silicon oxide layer, the thermal oxide layer 150 may be also formed on the lower surface of the silicon pattern 140 and the surface of the substrate 110, which are contacted with the buried insulation layer 125. The thickness of the thermal oxide layer 150 between a SOI silicon pattern 145 and the substrate 110 may be greater than the width of the opening 130 and the thickness of the buried insulation layer 125. The size of the silicon pattern 140 is reduced to form the SOI silicon pattern 145. However, the SOI silicon pattern 145 may be formed more thickly than that of the above-described embodiment because the top surface of the silicon pattern 140 can be prevented from being oxidized due to an oxidization inhibition layer 170 thereon. Subsequently, a semiconductor device with a local SOI structure as illustrated in FIG. 1 may be formed by performing a planarization process that exposes the top surface of the SOI silicon pattern 145.

Figure 7A:
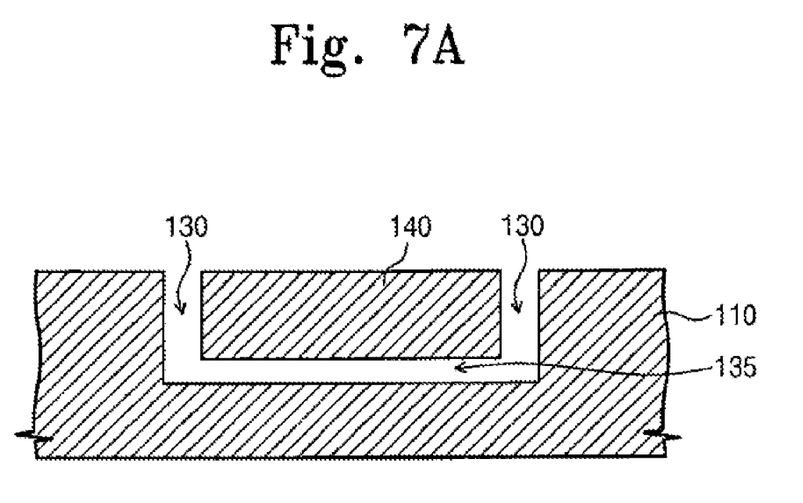
FIGS. 7A and 7B are cross-sectional views illustrating a method according to another embodiment of the present invention for forming the semiconductor device in FIG. 1.
Figure 7B:
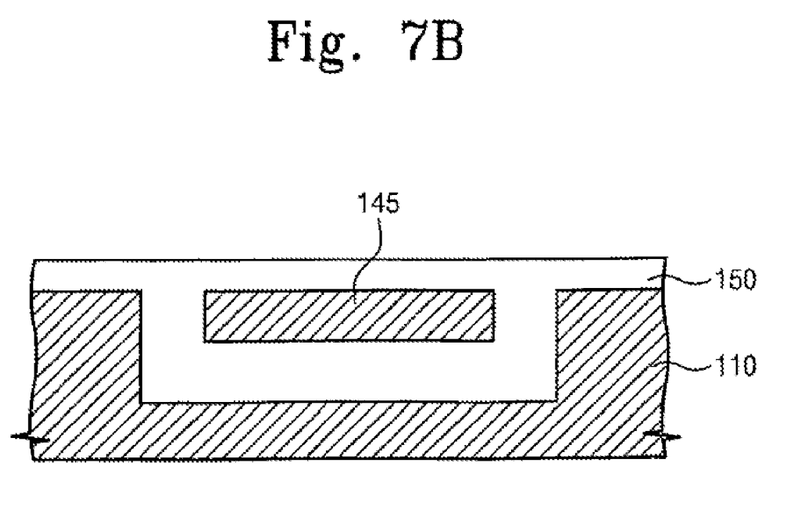

With reference to FIGS. 7A and 7B, a method according to another embodiment of the present invention of forming the semiconductor device as illustrated in FIG. 1 will be described. Parts described in the above embodiment with reference to FIGS. 5A through 5C can be identically applied to this embodiment.

Referring to FIG. 7A, a buried insulation layer 125 is selectively removed to form an air gap 135 by performing a wet etching process to the resultant structure of FIG. 5C. However, a bridge-type connection pattern may remain between the silicon pattern 140 and a substrate 110 when an opening 130 encloses a silicon pattern 140. The openings 130 at the both side the silicon pattern 140 can be communicated with each other via the air gap 135. An etching solution used in the wet etching process may be appropriately selected according to a buried insulation layer 125. For example, the etching solution may be a HF-containing solution or a buffered oxide etcher (BOE) when the buried insulation layer 125 is a silicon oxide layer, or be a phosphoric acid-containing solution when the buried insulation layer 125 is a silicon nitride layer.

Referring to FIG. 7B, a thermal oxide layer 150 is formed on the surface of the silicon pattern 140 through a thermal oxidation process. The thermal oxide layer 150 may be formed on the exposed surfaces of the silicon pattern 140 and the substrate 110. Oxygen can be easily supplied through the air gap 135 during the thermal oxidation process, thereby easily oxidizing the undersurface of the silicon pattern 140 and the surface of the substrate 110 opposite to each other. The thickness of the thermal oxide layer 150 between the SOI silicon pattern 145 and the substrate 110 may be greater than the widths of the opening 130 and the air gap 135 (thickness of the buried layer 125). The size of the silicon pattern 140 is reduced to form the SOI silicon pattern 145 during the thermal oxidation process. That is, the thickness and the width of the SOI silicon pattern 145 may be smaller than those of the silicon pattern 140. The thermal oxide layer 150 encloses the SOI silicon pattern 145. Subsequently, a semiconductor device with a local SOI structure as illustrated in FIG. 1 may be formed by performing a planarization process that exposes the upper surface of the SOI silicon pattern 145.

Figure 8:
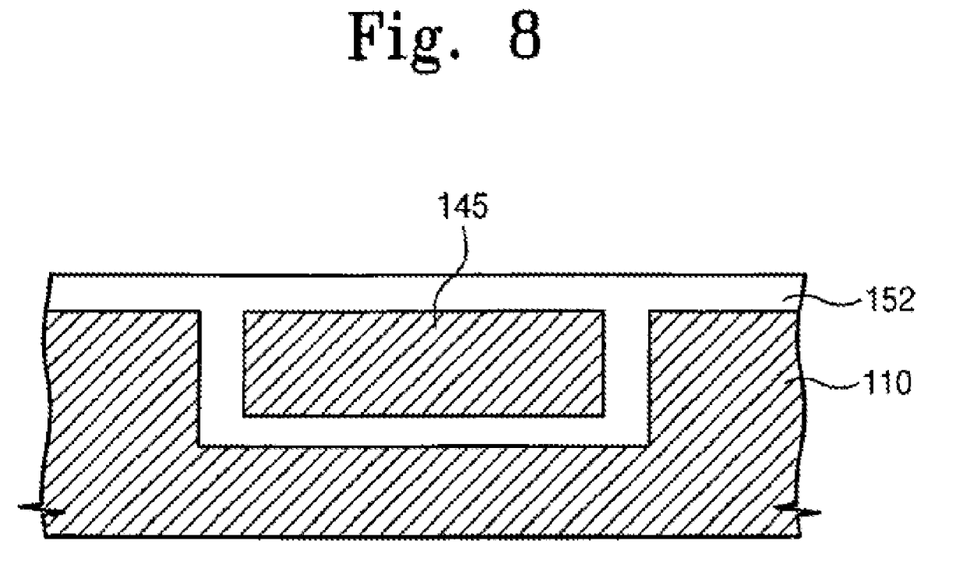
FIG. 8 is a cross-sectional view illustrating a method according to another embodiment of the present invention for forming the semiconductor device in FIG. 1.

With reference to FIG. 8, a method according to another embodiment of the present invention of forming the semiconductor device in FIG. 1 will be described. Parts described in the above embodiment with reference to FIGS. 5A to 5C and 7A can be identically applied to this embodiment.

A filling insulator 152 for filling an air gap 135 and/or an opening 130 may be formed by performing a vapor deposition process to the resultant structure in FIG. 5 or 7A. The vapor deposition process may be, for example, an atomic layer deposition (ALD) process. A SOI silicon pattern 145 can be formed without loss of a silicon pattern 140 because the filling insulator 152 is formed through a deposition process. That is, the SOI silicon pattern 145 may substantially have the same size as the silicon pattern 140. The filling insulator 152 may be also be formed on the upper surface of the SOI silicon pattern 145 and the substrate 110 while filling the air gap 135 and the opening 130. Thus, the filling insulator 152 can enclose the SOI silicon pattern 145. In addition, the filling insulator 152 may be form with various materials which can be deposited through the ALD process. For example, the filling insulator 152 may be formed with a silicon oxide or a material with superior insulating properties. Subsequently, a semiconductor device with a local SOI structure as illustrated in FIG. 1 may be formed by performing a planarization process that exposes the upper surface of the SOI silicon pattern 145.

With reference to FIGS. 9A through 9D, a method according to an embodiment of the present invention of forming the semiconductor device as illustrated in FIG. 2 will be described. Parts described in the above embodiment with reference to FIGS. 5A and 5B can be identically applied to this embodiment.

Figure 9A:
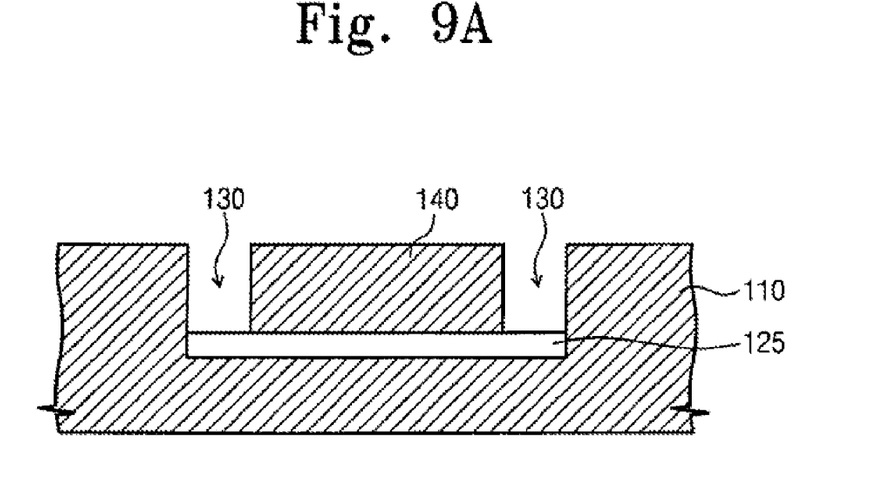
FIGS. 9A through 9D are cross-sectional views illustrating a method according to an embodiment of the present invention for forming the semiconductor device in FIG. 2.

Referring to FIG. 9A, an opening 130 formed by etching a substrate 110 exposes a buried insulation layer 125. The opening 130 can expose the edges of the buried insulation layer 125. The width of the opening 130 formed in this embodiment may be larger than the widths of the openings 130 formed in above-described embodiments. A silicon pattern 140 is formed on the buried insulation layer 125. The opening 130 and the buried insulation layer 125 separate the silicon pattern 140 from the substrate 110.

Figure 9B:
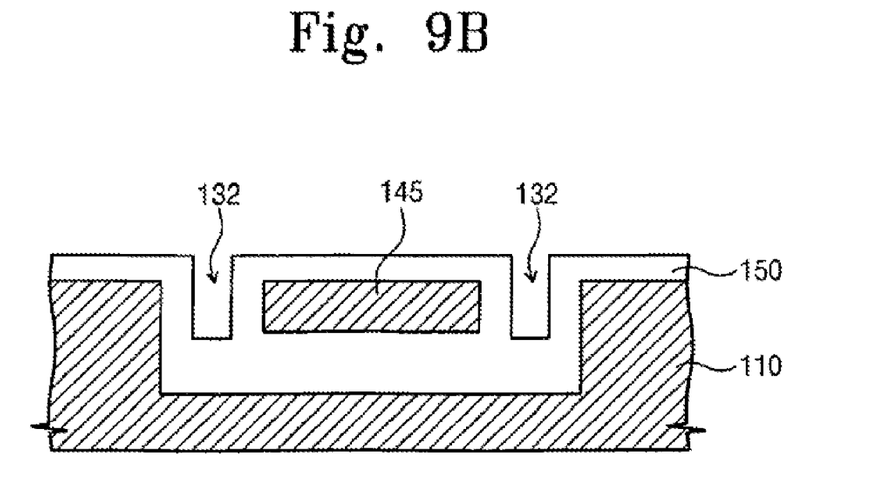

Referring to FIG. 9B, a thermal oxide layer 150 is formed on the surface of the silicon pattern 140 through a thermal oxidation process. The thermal oxide layer 150 may be formed on the surfaces of silicon pattern 140 and the substrate 110 exposed by an opening. When the buried insulation layer 125 is the silicon oxide layer, the thermal oxide layer 150 may be also formed on the bottom surface of the silicon pattern 140 and the surface of the substrate 110, which are contacted with the buried insulation layer 125. The size of the silicon pattern 140 is reduced to form the SOI silicon pattern 145 during the thermal oxidation process. That is, the thickness and the width of the SOL silicon pattern 145 may be smaller than those of the silicon pattern 140. The thermal oxide layer 150 may enclose the SOI silicon pattern 145. Since the width of the opening 130 is large, the thermal oxide layer 150 cannot fill the opening 130 fully, forming gap regions 132 between the SOI silicon pattern 145 and the substrate 110.

Figure 9C:
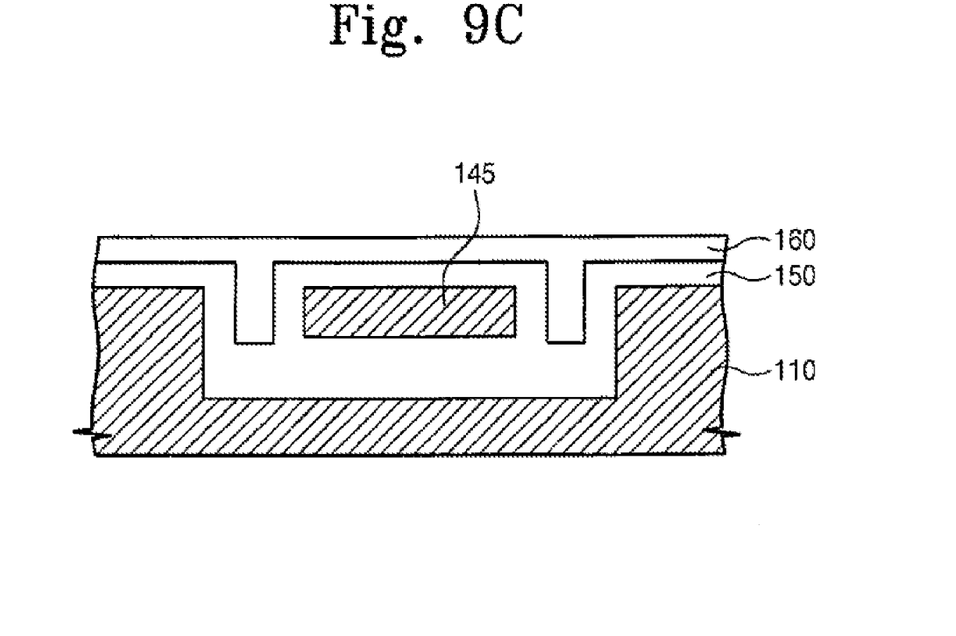

Referring to FIG. 9C, an insulating layer 160 is formed on the thermal oxide layer 150. The insulating layer 160 may be formed with a silicon oxide or a material with better insulating properties by performing, for example, a chemical vapor deposition.

Figure 9D:
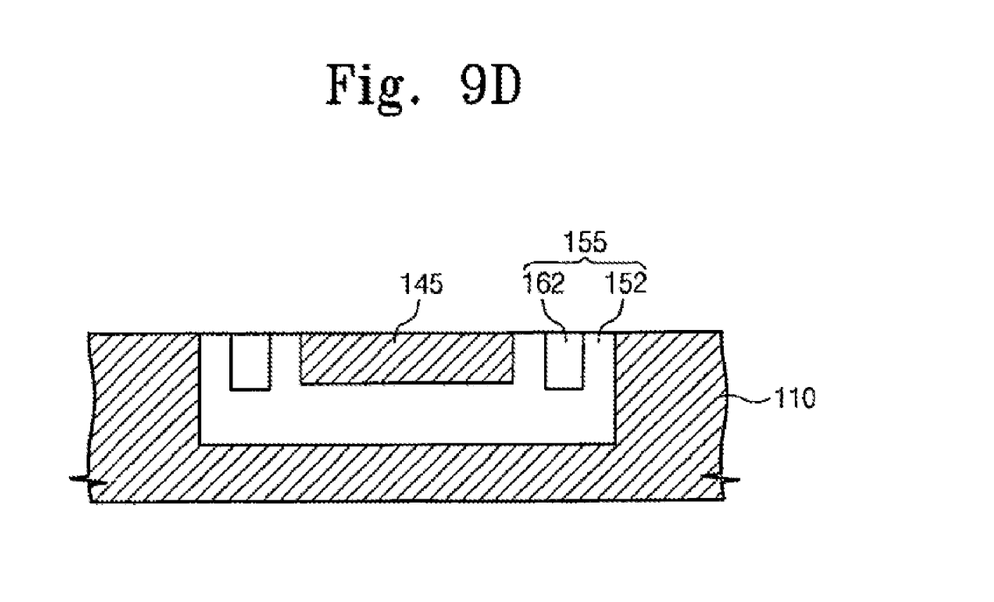

Referring to FIG. 9D, a planarization process exposes the upper surfaces of the SOI silicon pattern 145 and the substrate 110. A SOI insulating layer pattern 155 is interposed between the SOI silicon pattern 145 and the substrate 110, separating the SOI silicon pattern 145 from the substrate 110. The SOI insulating layer pattern 155 may include a thermal oxide layer pattern 152 and an insulating pattern 162. The SOI insulating layer pattern 155 may have a ⊔-shaped cross-section. The SOI silicon pattern 145 may have such a shape as to be inserted into a recess region of the insulating layer pattern 155.

Figure 10A:
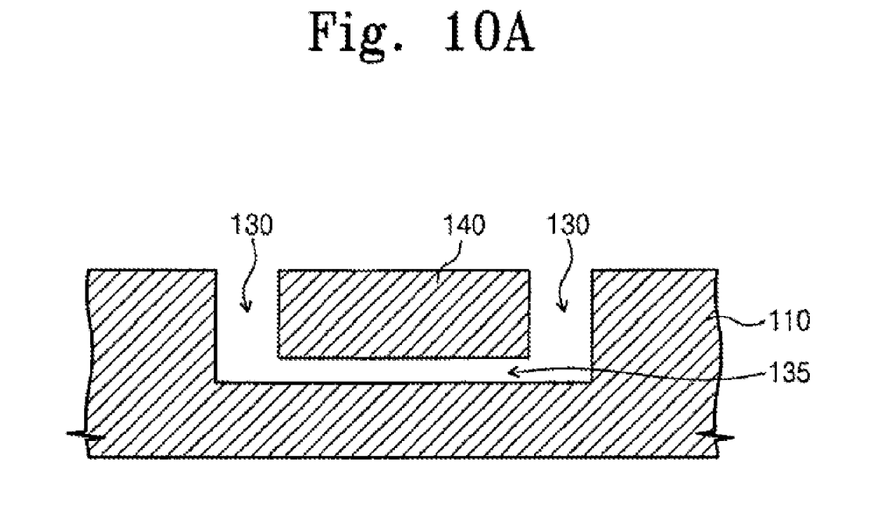
FIGS. 10A and 10B are cross-sectional views illustrating a method according to another embodiment of the present invention for forming the semiconductor device in FIG. 2.
Figure 10B:
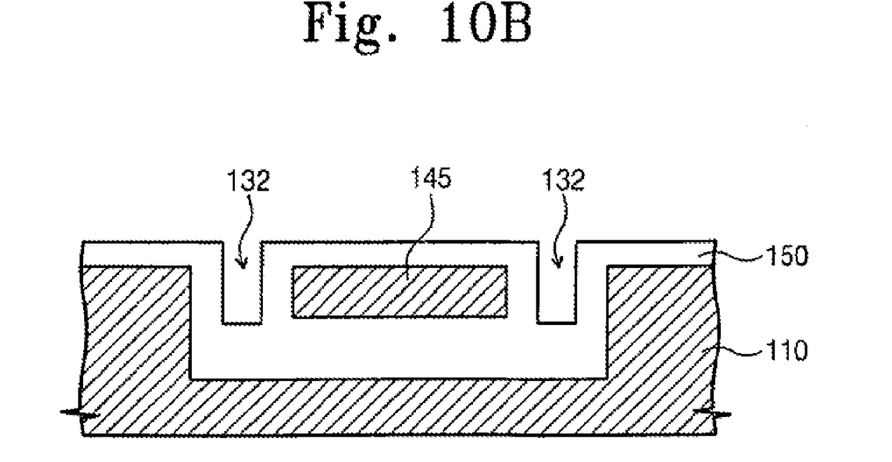

With reference to FIGS. 10A and 10B, a method according to another embodiment of the present invention of forming the semiconductor device in FIG. 2 will be described. Parts described in the above embodiment with reference to FIGS. 5A and 5B, and 9A can be identically applied to this embodiment.

Referring to FIG. 10A, a buried insulation layer 125 is removed to form an air gap 135 by performing a wet etching process to the resultant structure of FIG. 5. However, a bridge-type connection pattern may remain between the silicon pattern 140 and a substrate 110 when an opening 130 encloses a silicon pattern 140. The openings 130 at both sides of the silicon pattern 140 can be communicated with each other via the air gap 135. An etching solution used in the wet etching process may be appropriately selected according to a buried insulation layer 125. For example, the etching solution may be a HF-containing solution or a buffered oxide etcher (BOE) when the buried insulation layer 125 is a silicon oxide layer, or a phosphoric acid-containing solution when the buried insulation layer 125 is a silicon nitride layer.

Referring to FIG. 10B, a thermal oxide layer 150 is formed on the surface of the silicon pattern 140 through a thermal oxidation process. The thermal oxide layer 150 may be formed on the exposed surfaces of the silicon pattern 140 and the substrate 110. Oxygen can be easily supplied through the air gap 135 during the thermal oxidation process, thereby easily oxidizing the undersurface of the silicon pattern 140 and the surface of the substrate 110 opposite to each other. The size of the silicon pattern 140 is reduced to form the SOI silicon pattern 145 during the thermal oxidation process. That is, the thickness and the width of the SOI silicon pattern 145 may be smaller than those of the silicon pattern 140. The thermal oxide layer 150 encloses the SOI silicon pattern 145. Subsequently, a semiconductor device with a local SOI structure as illustrated in FIG. 2 may be formed by performing a planarization process that exposes the top surface of the SOI silicon pattern 145.

Figure 11A:
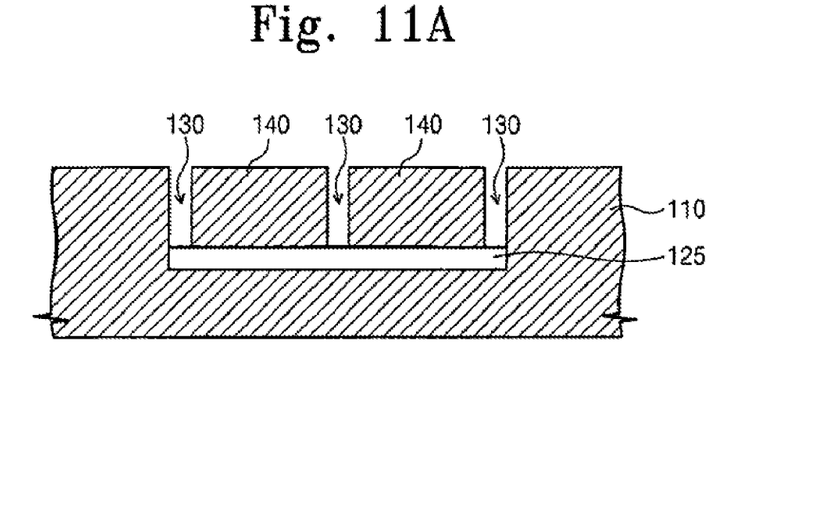
FIGS. 11A through 11C are cross-sectional views illustrating a method according to an embodiment of the present invention for forming the semiconductor device in FIG. 3.
Figure 11B:
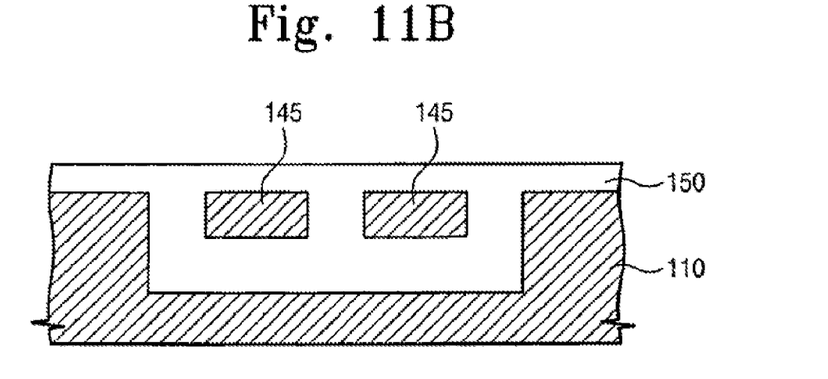
Figure 11C:
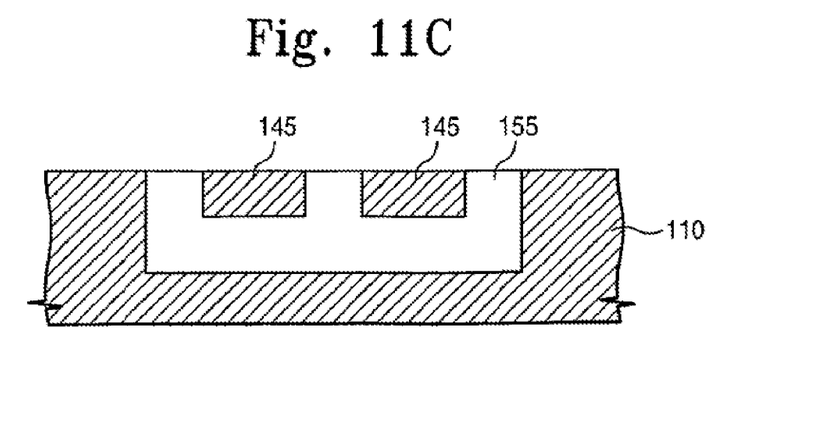

With reference to FIGS. 11A through 11C, a method according to an embodiment of the present invention of forming the semiconductor device as illustrated in FIG. 3 will be described. Parts described in the above embodiment with reference to FIGS. 5A and 5B can be identically applied to this embodiment.

Referring to FIG. 11A, an opening 130 formed by etching a substrate 110 exposes a buried insulation layer 125. The opening 130 can expose the edges and center of the buried insulation layer 125. The width of the opening 130 formed in this embodiment may be larger than the widths of the openings 130 formed in above-described embodiments. A silicon pattern 140 is formed on the buried insulation layer 125. The opening 130 and the buried insulation layer 125 separate the silicon pattern 140 from the substrate 110.

Referring to FIG. 11B, a thermal oxide layer 150 is formed on the surface of the silicon pattern 140 through a thermal oxidation process. The thermal oxide layer 150 may be formed on the surfaces of silicon pattern 140 and the substrate 110 exposed by an opening. When the buried insulation layer 125 is the silicon oxide layer, the thermal oxide layer 150 may be also formed on the bottom surface of the silicon pattern 140 and the surface of the substrate 110, which are contacted with the buried insulation layer 125. The size of the silicon pattern 140 is reduced to form the SOI silicon pattern 145 during the thermal oxidation process. That is, the thickness and the width of the SOI silicon pattern 145 may be smaller than those of the silicon pattern 140. The thermal oxide layer 150 encloses the SOI silicon pattern 145.

Referring FIG. 11C, a planarization process exposes the top surfaces of the SOI silicon pattern 145 and the substrate 110. A SOI insulating pattern 155 is interposed between the SOI silicon pattern 145 and the substrate 110, separating the SOI silicon pattern 145 from the substrate 110. Since the SOI insulating pattern 155 is interposed between the SOI silicon patterns 145 to separate the SOI silicon patterns from each other. The SOI insulating patterns 145 may have a multiple ⊔-shaped cross-section. The SOI silicon pattern 145 may have such a shape as to be inserted into a recess region of the insulating layer pattern 155. According to this embodiment, a plurality of the SOI silicon patterns can be formed on one SOI insulating pattern 155.

The semiconductor devices according to the embodiments of the present invention can include a local SOI structure. The local SOI structure enables various semiconductor devices to be efficiently highly-integrated into the same substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum, extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
a substrate;
a silicon pattern on the substrate, the silicon pattern having a bottom surface and sidewalls opposite to the substrate; and
an insulating pattern interposed between the substrate and the silicon pattern and in contact with the bottom surface and the sidewalls of the silicon pattern,
wherein the insulating pattern comprises:
a first insulating pattern interposed between the substrate and the silicon pattern and contacting the bottom surface and sidewalls of the silicon pattern, the first insulating pattern defining a gap region between the sidewalls of the silicon pattern and the substrate, and
a second insulating pattern disposed in the gap region, the second insulating pattern spaced apart from the silicon pattern and the substrate,
wherein the first insulating pattern and the second insulating pattern comprise mutually different materials.

2. The semiconductor device of claim 1, wherein the insulating pattern has a ⊔-shaped cross-section, and the silicon pattern is inserted into a recess region of the insulating layer pattern.

3. The semiconductor device of claim 1, wherein a plurality of silicon patterns are disposed on the insulating layer pattern.

4. The semiconductor device of claim 1, wherein the substrate comprises a first region and a second region, and the silicon pattern and the insulating layer pattern are disposed in the first region.

5. The semiconductor device of claim 4, further comprising an optical device disposed in the first region and an electrical device disposed in the second region.

\* \* \* \* \*